United States Patent [19]

Vakil

[11] Patent Number: 5,407,705
[45] Date of Patent: Apr. 18, 1995

[54] METHOD AND APPARATUS FOR PRODUCING ALUMINIDE REGIONS ON SUPERALLOY SUBSTRATES, AND ARTICLES PRODUCED THEREBY

[75] Inventor: Himanshu B. Vakil, Schenectady, N.Y.

[73] Assignee: General Electric Company, Schenectady, N.Y.

[21] Appl. No.: 24,043

[22] Filed: Mar. 1, 1993

[51] Int. Cl.⁶ .................... C23C 16/06; C23C 16/08
[52] U.S. Cl. .................. 427/255; 427/255.2; 427/255.7
[58] Field of Search ............ 427/248.1, 250, 252, 427/253, 255, 255.1, 255.2, 255.7

[56] References Cited

U.S. PATENT DOCUMENTS

| | | | |
|---|---|---|---|
| 4,350,719 | 9/1982 | Baldi | 427/255.7 |
| 4,405,660 | 9/1983 | Ulion et al. | 427/248.1 |
| 4,880,614 | 11/1989 | Strangman et al. | 427/248.1 |

OTHER PUBLICATIONS

Proceedings of Seventh International Conference on Chemical Vapor Deposition 1979; Brennfleck, K. et al. "Preparation of Hot Corrosion Resistant Aluminide Layers By CVD of Aluminum from its Subchloride" pp. 578–592.

Bunshah, R. F. ed., Deposition Technologies For Films And Coatings Noyes Publications, p. 122, 1982.

Primary Examiner—Shrive Beck
Assistant Examiner—Bret Chen
Attorney, Agent, or Firm—William H. Pittman

[57] ABSTRACT

A method and an apparatus for producing an adherent and oxidation-resistant aluminide region on the surface of a nickel- or cobalt-based superalloy article. A hypo-stoichiometric region of nickel or cobalt aluminide is produced by chemical vapor deposition on the surface of the article. Nickel or cobalt from the superalloy surface diffuses outward into the hypo-stoichiometric region, thus preventing migration of various refractory elements generally present in the superalloy, whose presence has a detrimental effect on the adhesion and oxidation resistance of a conventional aluminide region. A hyper-stoichiometric region of nickel or cobalt aluminide is then deposited by chemical vapor deposition on the hypo-stoichiometric region, to provide a sufficient supply of aluminum on the exposed surface of the article for forming a tough oxidation-resistant scale of alumina.

9 Claims, 1 Drawing Sheet

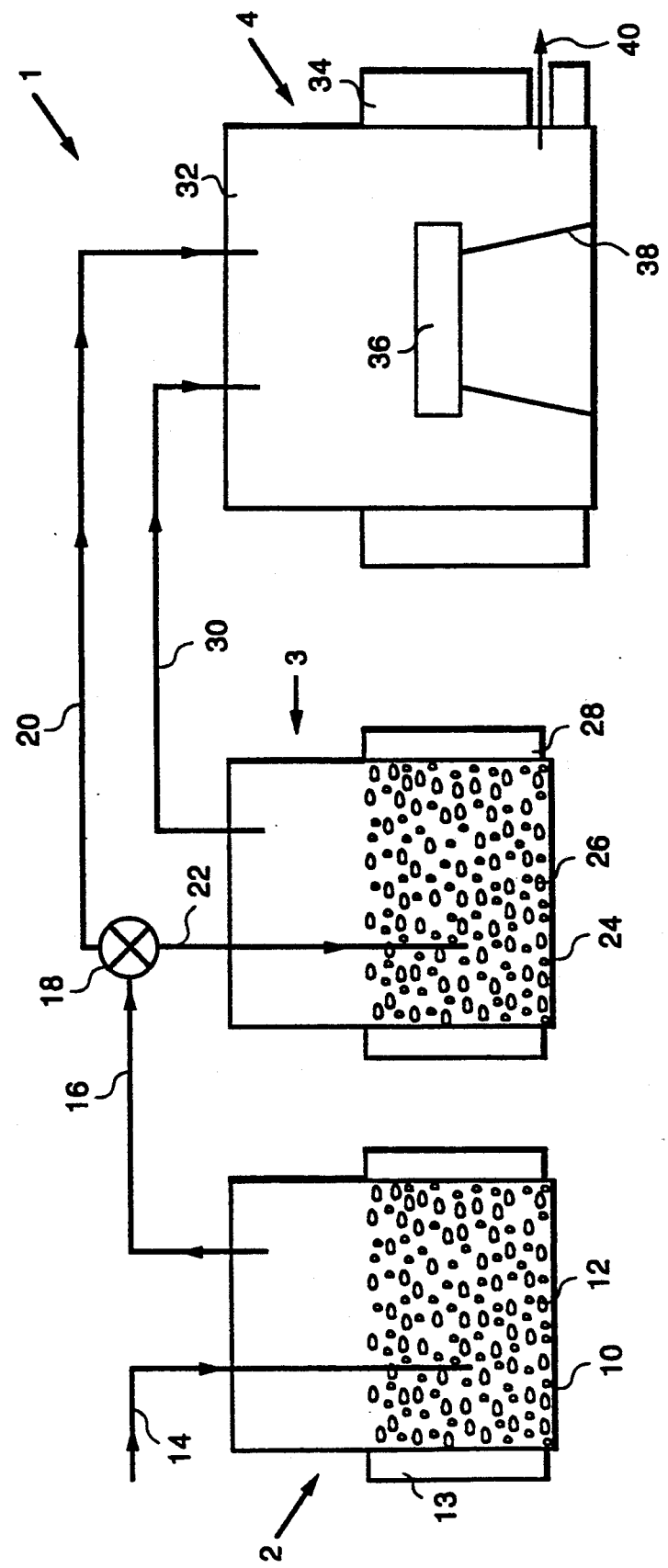

METHOD AND APPARATUS FOR PRODUCING ALUMINIDE REGIONS ON SUPERALLOY SUBSTRATES, AND ARTICLES PRODUCED THEREBY

CROSS-REFERENCE TO RELATED APPLICATION

The present application is related to commonly owned application Ser. No. 07/887,969, incorporated herein by reference.

FIELD OF THE INVENTION

The present invention relates to producing adherent and oxidation-resistant coatings on superalloys and more particularly to aluminide coatings having improved oxidation resistance.

BACKGROUND OF THE INVENTION

High performance superalloys, such as nickel-or cobalt-based superalloys, are being increasingly employed in various types of gas turbines used, for example, in the propulsion and power generation industries. Blades of high performance and high fuel efficiency turbine engines generally having a hollow core made of nickel- or cobalt-based superalloy are subjected to corrosive exhaust gases at extremely high temperatures of up to 1150° C. during the operation of such turbines. As a result, these blades are prone to oxidation damage. Various means have been tried to prevent such oxidation damage.

One means typically employed is to provide these blades with an environmentally resistant surface region of an aluminum-rich alloy, such as aluminide, whose surface oxidizes to form an aluminum oxide (alumina) scale at elevated temperatures. Such a scale provides a tough, adherent layer that is highly resistant to oxidation and corrosion attack. One example of such a protective diffusion layer is disclosed in U.S. Pat. No. 3,677,789 where nickel- or cobalt-based superalloy is provided with a coat of metallic aluminum alloyed with at least one metal of the platinum group.

In a typical aluminide coating process suitable for coating nickel- and cobalt-based superalloy surfaces, there are conflicting needs in terms of the desired aluminum content in the coating resulting therefrom. An aluminide region having more than 50 atomic percent aluminum is exceedingly desirable for producing a highly oxidation-resistant surface. However, when such a high concentration of aluminum is present, aluminum diffuses into the nickel-or cobalt-based superalloy substrate to form a nickel or cobalt aluminide region. Such a diffusion process is termed an inward diffusion process.

The presence of other superalloy constituents, especially refractory elements such as tungsten, tantalum and molybdenum, in the aluminide region adversely affects the degree of oxidation protection imparted by said region to the underlying superalloy substrate. The aforementioned problem can be somewhat alleviated by having an aluminide region with less than 50 atomic percent aluminum. When such a low concentration of aluminum is present in the aluminide region, nickel diffuses outward into said region, significantly limiting the presence of the aforementioned refractory elements therein. Such a diffusion process is termed an outward diffusion process. However, such a low concentration of aluminum in an oxidation-resistant aluminide region severely reduces its effectiveness since the amount of aluminum available for producing an oxidation-resistant alumina scale is small.

These diffusion phenomena create a situation where the various regions of the metals are not pure superalloy or pure aluminide, but rather mixtures of these and other materials in varying degrees. It is for that reason that they are referred to herein as "regions" rather than as layers of one metal or metal compound or another. It should be understood, however, that said regions are produced by techniques typical of those employed to produce layers of various metals in other contexts.

Thus, there exists a need for producing an effective oxidation-resistant aluminide surface region that will address the aforementioned concerns simultaneously by controlling the thermodynamic activity of aluminum during the deposition process.

STATEMENT OF THE INVENTION

The present invention is directed to a method of producing an adherent and oxidation-resistant aluminide region on a nickel-based or cobalt-based superalloy substrate, comprising the steps of:
  forming a region of hypo-stoichiometric aluminide on said substrate, said hypo-stoichiometric aluminide having the formula (I) $M_{(1-x)}Al_x$, 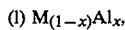

where x is at least about 0.36 and less than about 0.50 and M is nickel or cobalt; and
  forming an outer region of hyper-stoichiometric aluminide having the formula (II) $M_{(1-y)}Al_y$, 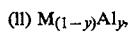

where y is about 0.50–0.55.

The invention is further directed to an article, such as a gas turbine blade, comprising a nickel-based or cobalt-based superalloy substrate, a region of said hypo-stoichiometric aluminide thereon, and an outer region of said hyper-stoichiometric aluminide on said hypo-stoichiometric aluminide region. In general, said article also comprises a scale of aluminum oxide on the exposed surface of said outer region of hyper-stoichiometric aluminide.

The invention is also directed to an apparatus for producing an aluminide region on the surface of a superalloy article, said apparatus comprising:
  first generator means for generating a mixture of hydrogen and aluminum trihalide;
  second generator means for generating a mixture of hydrogen and aluminum subhalides;
  chemical vapor deposition (hereinafter sometimes "CVD") means having heating means for maintaining said CVD means at a desired CVD temperature;
  switching means having a first and a second position for providing, in said first position, fluid communication between said first generator means and said CVD means, and, in said second position, fluid communication between said second generator means and said CVD means; and
  vent means for conducting reaction products out of said CVD means.

BRIEF DESCRIPTION OF THE DRAWINGS

The drawing is a schematic diagram of apparatus for forming an aluminide region on the surface of a superalloy article in accordance with the preferred embodiment of the present invention.

DETAILED DESCRIPTION

High performance superalloys are well known in the art. Nickel-or cobalt-based superalloy substrates are particularly suitable for receiving an aluminide region deposited by the method of the present invention. One example of nickel-based superalloy (all superalloy percentages being by weight) comprises 53% nickel, 19% iron, 18% chromium, 5% niobium, 3% molybdenum, 1% titanium, 0.5% aluminum, 0.05% carbon and 0.005% boron. Another example, known as MAR-M247, comprises 10% cobalt, 10% tungsten, 3.3% tantalum, 8.4% chromium, 0.65% molybdenum, 1.05% titanium, 5.5% aluminum, 1.4% hafnium and minor amounts of carbon and boron in a nickel matrix. One example of a cobalt-based superalloy comprises 57.5% cobalt, 10% nickel, 25% chromium and 7.5% tungsten. Still other superalloys are discussed in U.S. Pat. Nos. 4,209,348, 4,582,548, 4,643,782 and 4,719,080, all of which are incorporated herein by reference. It should be noted that sometimes trace amounts of elements such as yttrium and zirconium are also present in these superalloys. Nickel-based superalloy is preferred.

An aluminide region on the surface of a superalloy substrate, is generally produced by conventional means, such as CVD or pack aluminiding. Some of these methods are disclosed by Meier, G. H. and Pettit, F. S. in *High-Temperature Corrosion of Alumina-Forming Coatings for Superalloys*, Surface and Coatings Technology, 39/40 (1989), pp. 1–17, incorporated herein by reference. CVD conducted under isothermal conditions is preferred.

Turning to the drawing, there is shown a CVD apparatus, indicated by numeral 1, suitable for producing an adherent and oxidation-resistant aluminide region on the surfaces of nickel-or cobalt-based superalloy articles, such as gas turbine blades. Among the important features of apparatus 1 is first generator means 2, which produces a mixture of hydrogen and aluminum trihalide by contacting aluminum pellets (or, if desired, aluminum alloy pellets) with hydrohalic acid.

First generator means 2 comprises a chamber 10 suitable for retaining aluminum or aluminum alloy pellets 12 placed therein. Heating means 13 positioned on chamber 10 provides it with sufficient heat to generate the aforementioned mixture of aluminum trihalide and hydrogen. Chamber 10 is provided with inlet means 14 for conveying hydrohalic acid, preferably hydrochloric acid, into the aluminum or aluminum alloy. It will be apparent to one skilled in the art that hydrogen may be passed over heated aluminum trihalide to generate the mixture of hydrogen and aluminum trihalide, instead of generating the aluminum trihalide and hydrogen mixture by the aforementioned in situ process.

Apparatus 1 further comprises second generator means 3, which produces a mixture of hydrogen and aluminum subhalides by contacting the mixture of hydrogen and aluminum trihalide produced by first generator means 2 with aluminum or an alloy thereof. Pellets of aluminum alloyed with chromium, nickel, cobalt or any combination thereof, which do not melt under the operating conditions, are preferred. Typically, the weight percentage of aluminum in the alloy pellets varies from about 20% to about 40%; it is preferably about 30%.

Second generator means 3 further comprises a chamber 24 suitable for retaining aluminum or aluminum alloy pellets 26 placed therein. Heating means 28 positioned on chamber 24 provides it with the required heat to generate the aforementioned mixture of aluminum subhalides and hydrogen. Switching means 18, such as a three-position valve, provides fluid communication between first generator means 2 and second generator means 3 via conveying means 16 and conveying means 22 when switching means 18 is in a second position. Conveying means 22 conveys the mixture of hydrogen and aluminum trihalide produced by first generator means 2 through the aluminum liquid or pellets of aluminum alloy into chamber 24.

Apparatus 1 further comprises CVD means 4 in which an oxidation-resistant region on the surface of an article is produced by the method of the present invention. CVD means 4 comprises a reactor chamber 32 having stand means 38 located therein for positioning an article 36, such as a gas turbine blade. Reactor chamber 32 is surrounded by heating means 34, such as a thermal jacket, for maintaining its interior at a desired CVD temperature. Vent means 40, such an exhaust valve, is also positioned on reactor chamber 32 for continuously conducting out of reactor chamber 32 the reaction products produced during the CVD process. Reactor chamber 32 is capable of operating at, under or above atmospheric pressure, if needed. A pressure of about 0.2–1.0 atmosphere is preferred therein.

Conveying means 30 provides fluid communication between chamber 24 of second generator 3 and reactor chamber 32, such that when switching means 18 is in the second position, the aforementioned mixture of hydrogen and aluminum subhalides produced by second generator 3 is conveyed into the reactor chamber. Conveying means 30 is preferably heated by conventional heating means (not shown) to maintain the temperature of the mixture of hydrogen and aluminum subhalides before the mixture enters reactor chamber 32.

Conveying means 20, connecting switching means 18 with reactor chamber 32, provides fluid communication between first generator 2 and CVD means 4 when switching means 18 is in a first position for conveying the aforementioned mixture of hydrogen and aluminum trihalide produced by first generator means 2 into reaction chamber 32.

Before beginning the deposition of the adherent and oxidation-resistant region produced by the method of the present invention, the surface of the substrate is preferably degreased, grit blasted and then cleaned.

Turning now to the operation of the aforedescribed apparatus 1, hydrohalic acid, preferably hydrochloric acid, is conveyed via inlet means 14 into chamber 10, having aluminum alloy pellets 12 preferably maintained at about 400°–500° C. by heating means 13. The resulting reaction generates the desired gaseous mixture of hydrogen and aluminum trichloride.

Said gaseous mixture is then conveyed through conveying means 16 to switching means 18, switched to the first position, and then through conveying means 20 into reactor chamber 32 whose interior is maintained by heating means 34 at a desired isothermal CVD temperature in the range of about 900°–1100° C., preferably at about 1000° C. A region of hypo-stoichiometric aluminide is formed at the surface of the substrate of article 36 positioned inside reactor chamber 32 when hydrogen and aluminum trichloride react with the metal of the superalloy from which the substrate of article 36 is made. Said hypo-stoichiometric aluminide has formula I, in which x is at least about 0.36 and less than about 0.50, preferably about 0.45, and M is nickel or cobalt depending upon whether the superalloy substrate is nickel-or cobalt-based. Hypo-stoichiometric nickel aluminide is generally characterized by a brownish color.

The metal M of the superalloy diffuses outward into the region of hypo-stoichiometric aluminide. This prevents the refractory elements generally present in the superalloy from diffusing into said region. The following reaction takes place during the formation of the region of hypo-stoichiometric aluminide:

$2AlCl_3 + 2Ni$ or $2Co + 3H_2 = 2NiAl$ or $2CoAl + 6HCl\uparrow$.

Formation of hypo-stoichiometric aluminide is continued until a region having a thickness of about 0.05–0.1 mm., preferably about 0.06–0.07 mm., is formed.

Once the desired thickness is achieved, switching means 18 is switched to the second position for conveying the mixture of hydrogen and aluminum trichloride produced by first generator 2 into second generator 3 via conveying means 16 and 22. The temperature in second generator 3 is in the range of about 900°–1100° C. and is preferably about 1000° C. A mixture of hydrogen and aluminum subhalides, preferably subchlorides, is thus produced upon contact of the aluminum trichloride with aluminum liquid or, preferably, aluminum alloy pellets 26 placed inside chamber 24. The following reactions take place:

$2Al + AlCl_3 = 3AlCl\uparrow$ $Al + 2AlCl_3 = 3AlCl_2\uparrow$.

Said aluminum subhalides comprise a gaseous mixture of aluminum monohalide, aluminum dihalide and some aluminum trihalide. The mixture of hydrogen and aluminum subhalides is then conveyed by conveying means 30 into reactor chamber 32 whose interior is maintained by heating means 34 at a desired isothermal CVD temperature in the range of about 900°–1100° C., preferably at about 1000° C. Said mixture is preferably preheated to said isothermal CVD temperature before it enters reactor chamber 32. A region of hyper-stoichiometric aluminide is thus formed on the hypo-stoichiometric aluminide region when hydrogen and aluminum subchlorides react with the outward-diffused metal of the superalloy in the hypo-stoichiometric aluminide region. Hyper-stoichiometric aluminide has formula II, where y is about 0.50–0.55 and M is nickel or cobalt. Hyper-stoichiometric nickel aluminide is characterized by a bluish color and is sometimes referred as "blue zone aluminide". The following reactions take place during the formation of the hyper-stoichiometric aluminide region:

$2AlCl + 2Ni$ or $2Co + H_2 = 2NiAl$ or $2CoAl + 2HCl\uparrow$ $3AlCl + 2Ni$ or $2Co = 2NiAl$ or $2CoAl + AlCl_3\uparrow$ The formation of hyper-stoichiometric aluminide is continued until a region with a thickness of about 0.025–0.4 mm., preferably about 0.03–0.035 mm., is achieved.

During the operation of a gas turbine, oxidation of the surface thereof will take place to form a scale of aluminum oxide (alumina). If desired, the article having the aluminide layer may be oxidized in a controlled environment, by exposing its surface to air heated at about 1000°–1050° C., to produce such a scale before the article is used.

The oxidation-resistant aluminide region, usually having a scale of alumina thereon, may be further provided with a thermal barrier layer produced by any suitable conventional process, such as air plasma spray, electron beam physical vapor deposition or low pressure plasma spray. Low pressure spray is preferred. Any suitable ceramic thermal barrier layer may be used, a preferred composition being zirconia stabilized with yttria and comprising about 6–30% and preferably about 8–20% by weight of yttrium oxide. Other stabilizers suitable with zirconia are CaO, MgO and CeO$_2$. These zirconia ceramic layers have a thermal conductivity that is about a factor of thirty lower than that of the typical nickel-based superalloy substrate. Other ceramics which are believed to be useful as thermal barrier layers are alumina, ceria, hafnia (yttria-stabilized), mullite and zirconium silicate.

The present invention is also directed to an article having an adherent and oxidation-resistant aluminide surface region as described hereinabove. The thickness of the hypo-stoichiometric aluminide region on said article may be about 0.05–0.10 mm. and the thickness of the hyper-stoichiometric aluminide region about 0.0020–0.03 mm. An oxidation-resistant scale of aluminum oxide is generally disposed on the hyper-stoichiometric aluminide region. A thermal barrier layer having a thickness of about 0.07–1.25 mm. may be disposed on said scale of aluminum oxide for insulating the article from the high temperature gases that typically pass over it.

The invention is illustrated by an example in which several 6.4 mm. diameter buttons of polished Rene. 142 nickel-based superalloy were placed inside one end of a 38 mm. diameter alumina tube having 99.8% purity, to prevent any contamination with non-aluminum metals. A portion of the tube around that end was heated by means of a furnace to 1040° C. A portion of the tube at the other end was heated by means of a heat tape to 185° C. and a boat containing aluminum trichloride powder was placed inside that end of the tube. Another boat containing pellets of cobalt-aluminum alloy (Co$_2$Al$_5$) was placed inside the tube between the two ends, but for this portion of the experiment was rendered essentially inactive by heating only to 650° C.

A regulated stream of hydrogen gas, at atmospheric pressure, from a cylinder was passed over the boat containing aluminum trichloride to produce a gaseous mixture of hydrogen and aluminum trichloride, which was then conveyed for 3.5 hours through the tube over the heated buttons. A hypo-stoichiometric region was formed on the buttons. The temperature of the boat containing aluminum-cobalt alloy pellets was then raised to 1050° C. to produce a mixture of hydrogen and aluminum subchlorides. Said mixture was then passed over the buttons heated to 1050° C. for 1.5 hours to produce a hyper-stoichiometric region on the hypo-stoichiometric region.

Analytical details of the resulting articles at various levels, as determined by electron microprobe, are shown in Table 1.

TABLE I

| Element | Weight percent | | |
|---|---|---|---|
| | 2 microns below surface | 10 microns below surface | Substrate |
| Ni | 57 | 54.6 | 57.0 |
| Al | 30.2 | 27.5 | 5.8 |
| Co | 6.2 | 13.1 | 12.2 |
| Cr | 1.7 | 1.8 | 6.8 |
| W | 0 | 0.1 | 5.3 |
| Ta | 0 | 0.1 | 5.5 |
| Mo | 0.01 | 0 | 1.3 |
| Re | 0.016 | 0.05 | 4.2 |

From Table 1 it is readily apparent that the intermediate, hypo-stoichiometric region and the surface have insignificant amounts of the refractory elements that would normally be present in a hyper-stoichiometric surface region. Analysis of the substrate is provided for comparison.

In a control experiment, the same apparatus was employed but the cobalt-aluminum alloy pellets were maintained at 1050° C. for the entire deposition period. The results are listed in Table 2.

TABLE II

| Element | Wt. percent 2 microns below surface | Normalized atomic % |
|---|---|---|
| Ni | 45.4 | 33.8 |
| Al | 33.2 | 53.9 |
| Co | 9.8 | 7.3 |
| Cr | 4.4 | 3.7 |
| W | 2.7 | 0.64 |
| Ta | 2.7 | 0.66 |
| Balance | 1.8 | — |

Table 2 clearly shows the formation of a hyper-stoichiometric region having several undesired refractory metals, such as tungsten and tantalum, present therein.

What is claimed is:

1. A method of producing an adherent and oxidation-resistant aluminide region on a nickel-based or cobalt-based superalloy substrate, comprising the steps of:
   forming a first region of hypo-stoichiometric aluminide on said substrate, said hypo-stoichiometric aluminide having the formula (1) $M_{(1-x)}Al_x$, where x is at least about 0.36 and less than about 0.50 and M is nickel or cobalt; and
   forming on said first region a second region of hyper-stoichiometric aluminide having the formula (2) $M_{(1-y)}Al_y$, where y is about 0.50–0.55.

2. A method according to claim 1 wherein said regions of hypo-stoichiometric and hyper-stoichiometric aluminide are deposited by chemical vapor deposition under isothermal conditions.

3. A method according to claim 2 wherein the temperature of chemical vapor deposition is in the range of about 900°–1100° C.

4. A method according to claim 3 wherein said hypo-stoichiometric aluminide is formed by a reaction between aluminum trihalide, hydrogen and M.

5. A method according to claim 4 wherein said aluminum trihalide is aluminum trichloride.

6. A method according to claim 3 wherein said hyper-stoichiometric aluminide is formed by a reaction between aluminum subhalides, hydrogen and M.

7. A method according to claim 6 wherein said aluminum subhalides are a mixture of aluminum monochloride, aluminum dichloride and aluminum trichloride.

8. A method according to claim 7 wherein said mixture is produced by contacting aluminum trichloride with liquid aluminum or pellets of aluminum alloy.

9. A method of producing an adherent and oxidation-resistant aluminide region on the surface of a nickel-based or cobalt-based superalloy substrate, comprising the steps of:
   forming, by chemical vapor deposition, a first region of hypo-stoichiometric aluminide on the surface of said substrate, said hypo-stoichiometric aluminide having the formula (1) $M_{(1-x)}Al_x$, where x is at least about 0.36 and less than about 0.50 and M is nickel or cobalt; and
   forming, by chemical vapor deposition on said first region, a second region of hyper-stoichiometric aluminide having the formula (2) $M_{(1-y)}Al_y$, where y is about 0.50–0.55.

* * * * *